United States Patent [19]

Agoston et al.

[11] Patent Number: 4,734,576
[45] Date of Patent: Mar. 29, 1988

[54] ELECTRO-OPTIC SAMPLER

[75] Inventors: Agoston Agoston, Beaverton; Cornelis T. Veenendaal, Cornelius, both of Oreg.

[73] Assignee: Tektronix, Inc., Beaverton, Oreg.

[21] Appl. No.: 858,413

[22] Filed: May 1, 1986

[51] Int. Cl.⁴ .................................................. G02F 1/01
[52] U.S. Cl. ...................................... 250/225; 250/227; 324/77 K
[58] Field of Search ............... 250/225, 227, 208, 209, 250/210; 324/77 K; 350/355, 356, 374

[56] References Cited

U.S. PATENT DOCUMENTS

| | | | |
|---|---|---|---|
| 3,045,125 | 7/1962 | Mason | 250/210 |
| 3,311,748 | 3/1967 | Volpe et al. | 250/210 |
| 3,751,154 | 8/1973 | Frazee et al. | 250/209 |
| 4,388,528 | 6/1983 | Walter | 250/209 |
| 4,446,425 | 5/1984 | Valdmanis et al. | 324/77 K |
| 4,603,293 | 7/1986 | Mourou et al. | 324/77 K |

Primary Examiner—David C. Nelms
Attorney, Agent, or Firm—John Smith-Hill; Robert S. Hulse

[57] ABSTRACT

An electro-optic sampler comprises a body of semiconductor material that can be energized to emit polarized light, a photodetector device for generating an electrical output signal representative of the intensity with which light polarized in a predetermined manner is incident on the photodetector device, and a body of electro-optic material defining an optical waveguide for transmitting light from the source of polarized light to the photodetector. First and second electrodes are provided for establishing an electrical field within the body of electro-optic material. The body of electro-optic material has a spherical index ellipsoid when the first and second electrodes are at the same potential and otherwise has a non-spherical index ellipsoid.

18 Claims, 7 Drawing Figures

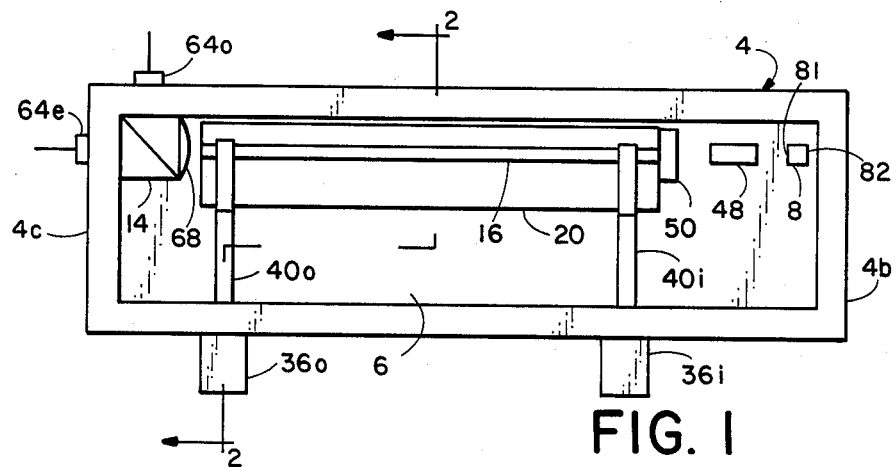
FIG. 1
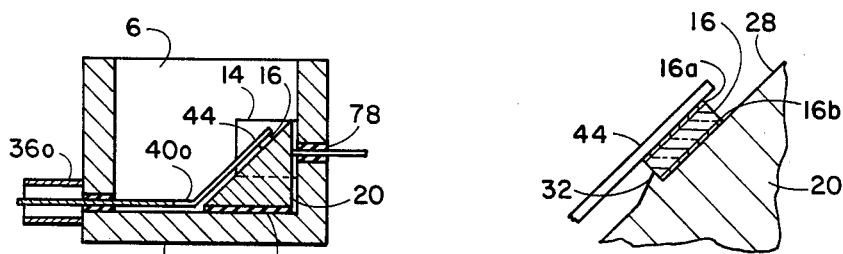
FIG. 2
FIG. 3
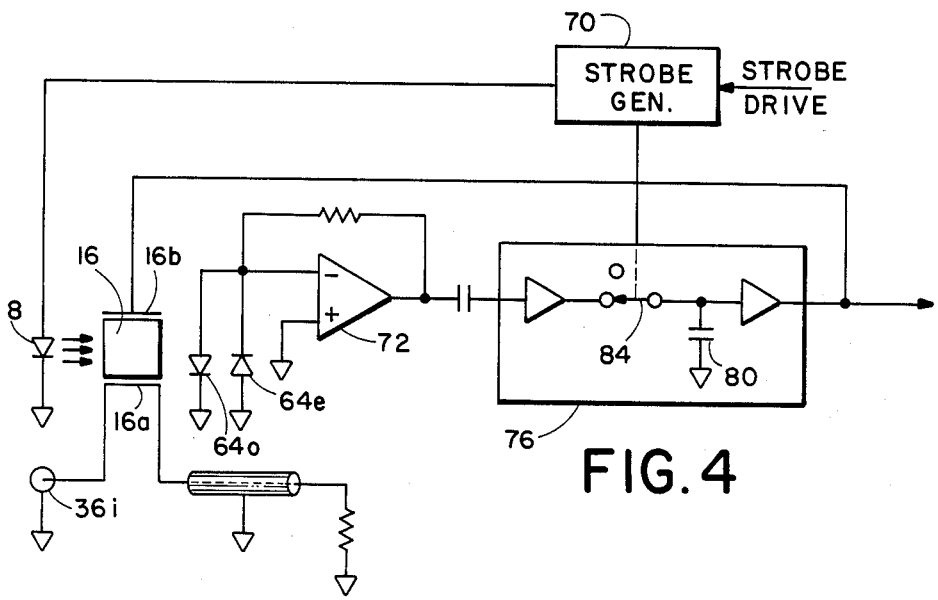
FIG. 4

ELECTRO-OPTIC SAMPLER

This invention relates to an electro-optic sampler.

BACKGROUND OF THE INVENTION

It is well-known to sample an electrical input signal by use of a sampling bridge. The conventional sampling bridge has a Schottky diode in each arm of the bridge. The input signal is applied to one corner of the bridge, and strobe pulses of opposite polarity are applied to the two corners adjacent the input corner. A quantity of charge proportional to the amplitude of the input signal at the time of application of the strobe pulses is stored on a capacitor that is connected to the remaining corner of the bridge.

Another type of sampler that is commonly used is the travelling wave sampler, in which the input signal is applied to each of two strings of series-connected Schottky diodes, the diodes of the two strings being connected with opposite polarity. A short delay line is interposed between the second and third diode of each string. In the steady state, the diodes are reverse biased. Strobe pulses overcome the reverse bias and allow signal charge to be injected into the delay lines. At the end of the strobe pulses, the diodes become reverse biased once more, and the signal charge is trapped on the delay lines. The trapped signal charge has a common mode component that is proportional to signal amplitude.

Both of these conventional samplers suffer from the disadvantage that Schottky diodes are susceptible to destruction due to electrostatic discharge. Moreover, blowby (transfer of signal charge through a diode when in the reverse biased state) influences the charge stored on the delay lines in the travelling wave sampler, resulting in distortion of the output signal generated from the quantity of charge stored on the delay lines.

An electro-optic sampler does not employ Schottky diodes in the sampling bridge, and therefore is not subject to the problems associated with those diodes. An electro-optic sampler comprises a pulsed source of polarized light, a photodetector device that generates an electrical signal representative of the intensity with which light polarized in a predetermined manner is incident on the photodetector device, and a body of electro-optic material defining an optical waveguide for transmitting light from the source of polarized light to the photodetector device. The body of electro-optic material has first and second electrodes for establishing an electrical field within the body of electro-optic material. As the light source is pulsed, the photodetector device provides an output signal representative of the field applied to the body of electro-optic material. Therefore, if one of the electrodes is grounded and the other electrode receives a signal to be sampled, the electrical signal provided by the photodetector device represents the instantaneous value of the input signal at each strobe.

Although the electro-optic sampler avoids the disadvantages of the conventional diode sampler that are associated with use of Schottky diodes, it is subject to other disadvantages. In particular, conventional laser diodes exhibit phase noise (variations in the wavelength of the light generated by the laser diode), and the static birefringence of the electro-optic material results in undesirable amplitude noise in the output signal.

The dynamic range of an input signal that can be sampled accurately is greater if error sampling is employed than if absolute value sampling is employed. In a conventional travelling wave error sampler, the signal charge captured on the delay lines during a strobe pulse is applied to an amplifier. The output of the amplifier is fed to a gated memory, which includes a memory capacitor and a memory gate switch. The switch is rendered conductive and non-conductive at the strobe rate. The voltage that is developed on the capacitor while the memory gate switch is conductive due to a first strobe pulse is used to bias the diodes of the sampler and the additional signal charge captured on the delay lines during the next strobe pulse is then dependent on the difference between the signal amplitude at the time of that strobe pulse and the signal amplitude at the time of the first strobe pulse. Further information concerning travelling wave samplers and memory bridges can be found in co-pending applications Ser. Nos. 06/845,900 and 06/851,859, now U.S. Pat. Nos. 4,647,795 and 4,659,946.

Hitherto, error sampling has not been used in conjunction with an electro-optic sampler.

A conventional laser diode has two opposite facets from which light is emitted substantially simultaneously when the diode is pulsed. The two beams are of substantially equal intensity. Conventionally, the beam emitted from one facet of the laser diode is used to act on an external agent or medium and the beam emitted from the other facet is used to monitor the power output of the laser diode.

SUMMARY OF THE INVENTION

In accordance with a first aspect of the present invention there is provided an electro-optic sampler comprising a body of semiconductor material that can be energized to emit polarized light, a photodetector device for generating an electrical output signal representative of the intensity with which light polarized in a predetermined manner is incident on the photodetector device, a body of electro-optic material defining an optical waveguide for transmitting light from the source of polarized light to the photodetector, and first and second electrodes for establishing an electrical field within the body of electro-optic material, the body of electro-optic material having a spherical index ellipsoid when the first and second electrodes are at the same potential and otherwise having a non-spherical index ellipsoid.

In accordance with a second aspect of the present invention there is provided an error sampler comprising a source of polarized light, a strobe generator for pulsing the source of polarized light, a photodetector device for generating an electrical signal representative of the intensity with which light polarized in a predetermined manner is incident on the photodetector device, a body of electro-optic material defining an optical waveguide for transmitting light from the source of polarized light to the photodetector, first and second electrodes for establishing an electrical field within the body of electro-optic material, said first electrode being connected to receive an electrical signal to be sampled, and feedback means for applying the signal developed by the photodetector in response to a first optical pulse to the second electrode at the time of application of a second optical pulse, so that the electro-optic material is electrically stressed to an extent dependent on the difference between the amplitude of the input signal at the time of the first optical pulse and the amplitude of the input signal at the time of the second optical pulse.

In accordance with a third aspect of the invention there is provided an electro-optic sampler comprising a body of semiconductor material that can be energized to emit light in first and second opposite directions, first and second photodetector devices, and first and second bodies of electro-optic material defining respective waveguides for transmitting light emitted by the semiconductor device in the first and second directions to the first and second photodetector devices respectively.

BRIEF DESCRIPTION OF THE DRAWINGS

For a better understanding of the invention, and to show how the same may be carried into effect, reference will now be made, by way of example, to the accompanying drawings in which:

FIG. 1 is a top plan view of a first electro-optic sampler embodying the present invention, FIG. 2 is a sectional view taken on the line II—II of FIG. 1, FIG. 3 is an enlarged view of a detail of FIG. 2, FIG. 4 is a block diagram illustrating use of the sampler shown in FIG. 1 in an error sampled feedback loop.

DETAILED DESCRIPTION

Figure 5:
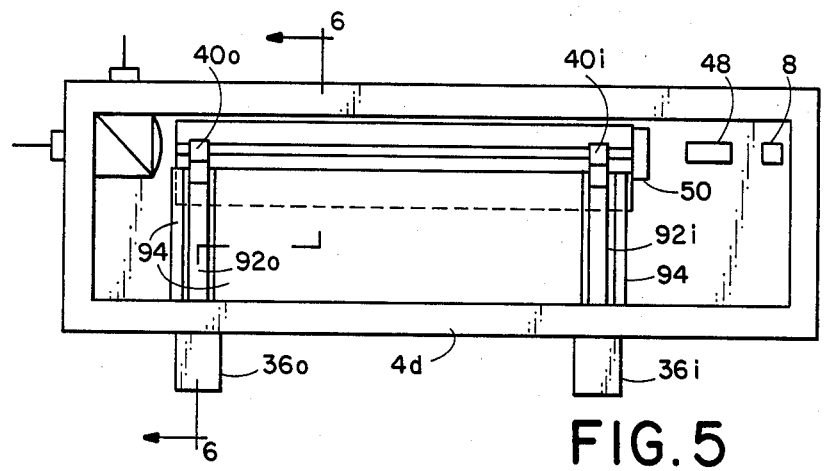
FIGS. 5 and 6 are views similar to FIGS. 1 and 2 showing a second electro-optic sampler embodying the present invention.

The electro-optic sampler shown in FIGS. 1, 2 and 3 comprises a housing 4 having a base 4a and opposite end walls 4b and 4c. The housing 4 defines a cavity 6. A laser diode 8 is mounted in the cavity 6 adjacent the end wall 4b. When it is energized, the laser diode emits a narrow beam of linearly-polarized light at, e.g., 1300 nm. The diode is oriented so that the beam is directed towards the end wall 4c and is horizontally polarized. A beam-splitting analyzer cube 14 is mounted in the cavity 6 adjacent the end wall 4c. Also mounted inside the cavity 6 is an elongate monocrystalline body 16 of cubic crystalline material, such as indium phosphide. The body 16 is mounted on a block 20 of metal that is supported on the base 4a of the housing 4 and is electrically isolated from the housing 4 by a sheet 22 of dielectric material. The body 16 is mounted on a surface 28 of the block 20 that is inclined to the horizontal at an angle of 45 degrees. A small ledge 32 is formed on the block 20 in its surface 28 for locating the body 16. The body 16 has metallization layers 16a and 16b on its two opposite main faces and is attached to the block 20 at a point halfway along its lower main face by a drop of silver epoxy (not shown).

The body 16 defines an optical waveguide connecting the laser diode 8 to the analyzer cube 14. The body 16 is oriented with its 011 crystal axis in the direction of propagation of light along the waveguide from the laser diode to the analyzer cube and its 100 crystal axis perpendicular to the surface 28. The 01-1 axis lies parallel to the surface 28 and perpendicular to the 011 and 100 axes.

A graded index lens 48, e.g., of the kind sold under the trademark SELFOC, is positioned between the laser diode 8 and the body 16 for focusing light emitted by the laser diode on the entrance face of the waveguide. A compensator 50 is mounted on the block 20 adjacent the entrance face of the waveguide. The compensator 50 transforms the horizontally-polarized light beam received from the laser diode into a circularly-polarized beam. The circularly-polarized beam that enters the waveguide can be regarded as being propagated along the waveguide in the form of a component that is linearly polarized parallel to the 01-1 axis of the body 16 (i.e., having its electric field vector parallel to the 01-1 axis) and a component that is linearly polarized parallel to the 100 axis (i.e., having its electric field vector parallel to the 100 axis). On leaving the waveguide by way of its exit face the two linearly polarized components are recombined. The combined beam is split by the analyzer cube 14 into an ordinary beam that is polarized vertically and an extraordinary beam that is polarized horizontally, and these two beams are directed towards respective photodetectors $64_e$ and $64_o$. A lens 68 focuses the exit face of the waveguide on the two photodetectors.

The frame 4 carries two connectors $36_i$ and $36_o$ for connection to respective coaxial cables (not shown). Each connector has a center conductor that is connected in a manner not shown to a metal leaf spring 40 that extends horizontally across the cavity 6. The outer conductor of each connector is connected to the housing 4 and is grounded. Just short of the block 20, the spring is bent upwards at an angle of 45 degrees, and its free end 44 engages the metallization layer 16a. The distance between the spring 40 and the base 4a of the housing 4 is uniform over the horizontal portion of the spring, and similarly the distance between the inclined portion of the spring and the inclined surface 28 of the block 20 is uniform.

The cable that is connected to the connector $36_i$ is connected to a signal source (not shown) and the cable that is connected to the connector $36_o$ is terminated in its characteristic impedance. Therefore, when an electrical signal to be sampled is applied to the connector $36_i$, current flows along the leaf spring $40_i$, the metallization layer 16a, and the spring $40_o$ and returns to ground through the connector $36_o$ and the termination of the cable that is connected to that connector. As current flows through the metallization layer 16a, an electric field parallel to the 100 axis is created in the body 16 and propagates along the body 16.

Cubic crystals such as indium phosphide and gallium arsenide have the property that they are isotropic when they are not electrically stressed but become anisotropic upon being electrically stressed. Therefore, when a cubic crystal is not electrically stressed, its index ellipsoid (the surface representing the value of the refractive index of the material in different propagation directions radiating from the intersection of the major and minor axes of the ellipsoid) is spherical, but when the crystal is electrically stressed the index ellipsoid departs from spherical form. In particular, when the crystal is electrically stressed by a field parallel to the 100 axis, the velocity with which a disturbance having an electric field vector parallel to the 01-1 axis propagates in a direction parallel to the 011 axis depends on the magnitude and direction of the electric field, whereas the velocity with which a disturbance having an electric field vector parallel to the 100 axis propagates in that same direction is independent of the electric field. Therefore, the velocity of propagation in the waveguide of the component of the input light beam that is polarized parallel to the 01-1 crystal axis of the body 16 depends on the magnitude and polarity of the potential difference between the metallization layers 16a and 16b, whereas the velocity of propagation of the component of the light beam that is polarized parallel to the 100 axis is independent of the potential difference. This latter component propagates at substantially the same velocity as the electric field due to current flowing through the metallization layer 16a, there being a slight difference due to the fact that the body 16 is not of infinite extent in the direction parallel to the 01-1 axis.

Owing to the different velocities of propagation through the waveguide of the two linearly-polarized components, a phase difference is induced between the two components as they propagate through the waveguide. Since the two components are polarized in different directions they cannot interfere. However, when each component is resolved by the analyzer cube into an ordinary component and an extraordinary component, the ordinary components are able to interfere mutually and the extraordinary components are able to interfere mutually. It can be shown that the induced phase difference affects the combined amplitude of the ordinary components in the opposite sense from that in which it affects the combined amplitude of the extraordinary components: if the ordinary components interfere destructively, the extraordinary components interfere constructively, and vice versa.

The two photodetectors $64_o$ and $64_e$ comprise respective photodiodes that are connected in series with the anode of the photodiode $64_o$ connected to the cathode of the photodiode $64_e$, and the point of connection of the two diodes is connected to the inverting input of an operational amplifier 72. The diodes are unbiased. The non-inverting input of the amplifier 72 is grounded and the output of the amplifier is connected to apply feedback to the inverting input.

When a photodiode is illuminated, it conducts a current having a magnitude dependent on the intensity of illumination. In the circuit arrangement shown in FIG. 4, the common mode component of the currents conducted by the photodiodes $64_o$ and $64_e$ circulates through the diodes, and only the differential component is amplified. Therefore, the output signal of the amplifier 72 is proportional to the difference between the illumination intensities of the two photodiodes, which is in turn dependent on the phase difference existing between the two linearly-polarized components at the exit face of the waveguide.

As shown in FIG. 4, the laser diode 8 is connected to a strobe generator 70, which may be of the form described in co-pending application Ser. No. 06/858,405 filed Apr. 30, 1986. The strobe generator periodically pulses the laser diode, and therefore the light beam emitted by the laser diode is a pulsed beam. Each pulse is of, e.g., 25 ps in duration and the frequency of the pulses may be, e.g., 10 MHz. It will therefore be seen that the output signal that is generated by the amplifier 72 in response to a strobe pulse is dependent on the potential difference between the two metallization layers 16a and 16b during the time that the corresponding optical pulse is propagating along the waveguide. It will be appreciated that the relationship between the output signal and the potential difference is not degraded by variations in the potential difference at a given point along the waveguide as the optical pulse propagates along the waveguide, because the electric field due to the potential difference propagates at substantially the same velocity as the optical component that is polarized parallel to the 100 axis of the crystal.

The output signal of the amplifier 72 is applied to a gated memory 76. The gated memory includes a memory capacitor 80 and a memory gate switch 84 that controls the charging of the capacitor 80 in accordance with a memory gate control signal received from the strobe generator. The output signal of the gated memory constitutes the output signal of the sampler and is fed back to the sampling head to close the error sampling feedback loop. In particular, the output signal of the gated memory 76 is applied to the block 20 by way of an insulating feed-through 78 and thus to the metallization layer 16b, and consequently the electric field that is applied to the body 16 depends not on the absolute value of the potential on the metallization layer 16a when the optical pulse passes through the waveguide but on the difference between the potential on the layer 16a at the time a given optical pulse passes through the waveguide and the potential that was on the layer 16a when the previous optical pulse passed through the waveguide.

Since the housing 4 is grounded, and the potential fed back to the body 20 from the gated memory 76 varies at a relatively low rate, the uniform distance between the spring 40 and the base 4a of the housing 4 and between the spring 40 and the block 20 results in there being transmission lines between the connectors 36 and the free ends 44 of the springs. The characteristic impedance of these transmission lines is equal to that of the cables that are connected to the connectors 36. There is a slight discontinuity in the characteristic impedance at the point where the springs are bent upwards to follow the surface 28, but this is not sufficient to degrade substantially the performance of the transmission lines.

Figure 6:
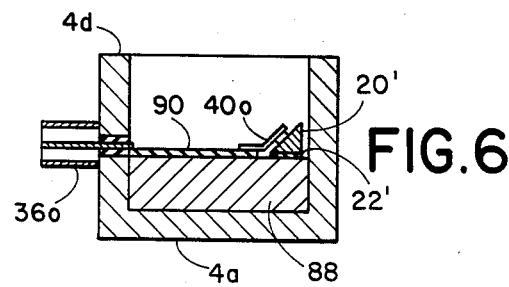

A problem associated with the FIG. 1 sampling head arises from the difficulty of stressing the leaf springs 40 to generate sufficient contact pressure at their free ends 44 and at the same time maintaining a uniform distance between the leaf springs 40 and the base 4a of the housing 4. This problem may be alleviated by use of a coplanar transmission line structure as shown in FIGS. 5 and 6. In this case, an insert 88 of metal is placed on the base 4a of the housing 4 and a rigid plate 90 of dielectric material is positioned on top of the insert 88 and extends from the side wall 4d of the housing. The block 20' rests on top of the insert 88 and is electrically isolated from the insert 88 by the sheet 22' of dielectric material. The dimensions of the block 20' in directions transverse to its length are shorter than those of the block 20 of FIG. 1 and therefore the body 16 of FIGS. 5 and 6 is at the same position relative to the base and side walls of the housing 4 as is the body 16 of FIG. 1. The outer edge of the plate 90 is spaced slightly from the surface 28 of the block 20'. The plate 90 has signal runs $92_i$ and $92_o$ and ground conductors 94 on its upper surface. The signal runs are connected to the center conductors of the connectors 36 and the ground conductors 94 are electrically connected to the side wall 4a of the housing. The leaf springs 40' are attached to the plate 90 and are in electrically conductive contact with the signal runs 92. The leaf springs 40' project only a short distance beyond the outer edge of the plate 90, and therefore are not deflected to the same extent as the springs 40 of FIG. 1 when a given contact pressure is generated at their free ends.

Figure 7:
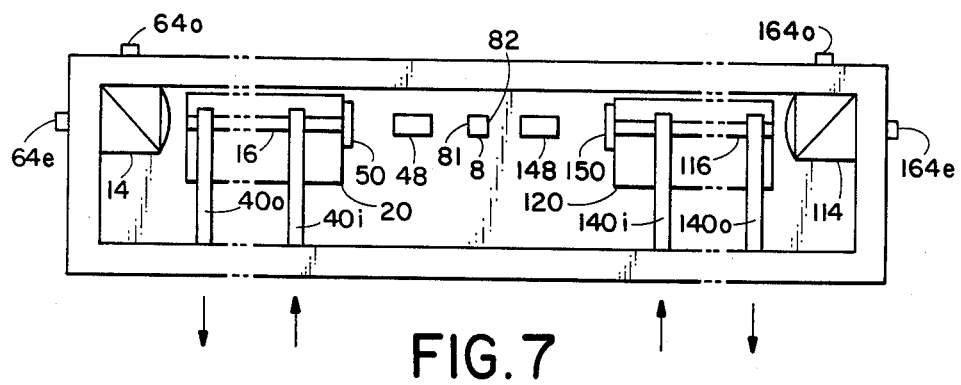
FIG. 7 is a simplified top plan view of a third electro-optic sampler embodying the present invention.

The laser diode 8 shown in FIG. 1, emits light both from its front facet 81 and from its back facet 82. The light emitted from the back facet 82 may be used to monitor the power level of the laser pulses, as is conventionally done with laser diodes owing to the high temperature dependence of the power output of such diodes. However, since the laser diode 8 is operated in pulsed mode rather than CW mode, it is not in fact necessary to monitor the power level in this manner. FIG. 7 illustrates a dual channel sampling head in which the structure shown to the left of the laser diode in FIG. 1 is duplicated to the right of the diode, and therefore allows simultaneous sampling of two different signals. This may be used, for example, to monitor time intervals between corresponding events in two signals. In FIG. 7, the same reference characters are used to denote elements to the left of the diode 8 as are used in FIG. 1, and a prefix 1 is applied to those characters to denote corresponding elements to the right of the diode 8.

It will be appreciated that the present invention is not restricted to the particular embodiments that have been described and illustrated, and that variations may be made therein without departing from the scope of the invention as defined in the appended claims and equivalents thereof. For example, it is not essential to the invention that beam-splitting cubes be used to resolve the two polarization components of the output light beam from the waveguide into the ordinary and extraordinary components, and other arrangements may be used instead. In addition it is not essential to the invention that the current flow through the metallization layer 16a be in the direction of propagation of the optical pulses. If the direction of current flow was opposite from the direction of optical propagation, a low-pass filtering effect would be provided. The circuit arrangement of the diodes 64 and the amplifier 72 is not restricted in its application to photodiodes or even to two-terminal devices: by connecting the collector-emitter paths of two unbiased bipolar transistors in series between two reference potential levels, the differential current at the point of connection of the two transistors is dependent on the difference in base currents of the two transistors.

We claim:

1. An electro-optic sampler comprising a body of semiconductor material that can be energized to emit light in two opposite directions, first photodetector means, second photodetector means, first and second bodies of electro-optic material defining respective waveguides for transmitting light emitted by the semiconductor device in said first and second directions to the first photodetector means and the second photodetector means respectively, and first and second pairs of electrodes associated with the first and second bodies of electro-optic material for establishing an electrical field within the respective bodies of electro-optic material.

2. A sampler according to claim 1, wherein the light emitted by the body of semiconductor material is linearly polarized in a predetermined direction and the sampler further comprises first and second compensators for transforming the linearly-polarized light into circularly-polarized form prior to transmission by the waveguides, and wherein the electrodes of each pair are positioned to establish electrical fields that are oriented obliquely with respect to said predetermined direction.

3. A sampler according to claim 1, wherein the body of semiconductor material is a laser diode and the sampler further comprises a strobe generator connected to the laser diode for causing the laser diode to emit pulsed beams of light.

4. An error sampler comprising a source of polarized light, a strobe generator for pulsing the source of polarized light, a photodetector for generating an electrical signal representative of the intensity with which light polarized in a predetermined manner is incident on the photodetector, a body of electro-optic material defining an optical waveguide for transmitting light from the source of polarized light to the photodetector, first and second electrodes for establishing an electrical field within the body of electro-optic material, said first electrode being connected to receive an electrical input signal to be sampled, and feedback means for applying the signal generated by the photodetector in response to a first optical pulse to the second electrode at the time of application of a second optical pulse, so that the electro-optic material is electrically stressed to an extent dependent on the difference between the amplitude of the input signal at the time of the first optical pulse and the amplitude of the input signal at the time of the second optical pulse.

5. A sampler according to claim 4, wherein the light emitted by the source of polarized light is linearly polarized and the sampler further comprises a compensator for transforming the linearly-polarized light into circularly-polarized form prior to transmission by the waveguide, and wherein the electrodes are positioned to establish an electric field that is oriented obliquely with respect to the direction of polarization of the linearly-polarized light.

6. A sampler according to claim 4, comprising an analyzer positioned to receive light transmitted from the source through the waveguide and to divide light received by the analyzer into an ordinary beam and an extraordinary beam, and wherein said photodetector is positioned to receive the ordinary beam and the sampler further comprises a second photodetector positioned to receive the extraordinary beam.

7. A sampler according to claim 6, wherein the first-mentioned photodetector and the second photodetector comprise first and second photosensitive devices respectively, the first and second photosensitive devices each having first and second electrodes, the first electrode of the first photosensitive device being connected to a reference potential level, the second electrode of the first photosensitive device being connected to the first electrode of the second photosensitive device, and the second electrode of the second photosensitive device being connected to a reference potential level, each of said photosensitive devices being a unidirectionally-conductive device which responds to optical stimulation by conducting current in the direction from the first electrode to the second electrode, and the first and second photosensitive devices being unbiased, and the sampler further comprising an amplifier having an input terminal connected to the second electrode of the first photosensitive device and also having an output terminal, and a feedback resistor connected to apply feedback from the output terminal of the amplifier to the input terminal thereof.

8. A sampler according to claim 7, wherein the first and second photosensitive devices comprise respective photodiodes.

9. A sampler according to claim 7, comprising a gated memory including a memory capacitor and a memory gate switch, the memory gate switch being operative to couple the memory capacitor to, and decouple the memory capacitor from, the output terminal of the amplifier in response to a memory gate control signal generated by the strobe generator, and wherein the gated memory has an output terminal at which a potential dependent on the charge stored in the memory capacitor is stored, the output terminal of the gated memory being connected to said second electrode.

10. An electro-optic sampler comprising a body of semiconductor material that can be energized to emit polarized light, a photodetector for generating an electrical output signal representative of the intensity with which light polarized in a predetermined manner is incident on the photodetector, a body of electro-optic material defining an optical waveguide for transmitting light from the body of semiconductor material to the photodetector, and first and second electrodes for establishing an electrical field within the body of electro-optic material, the body of electro-optic material having a spherical index ellipsoid when the first and second electrodes are at the same potential and otherwise having a non-spherical index ellipsoid.

11. A sampler according to claim 10, wherein the body of semiconductor material is a laser diode that emits linearly polarized light, and the electro-optic material is cubic crystalline material.

12. A sampler according to claim 11, wherein the body of electro-optic material is oriented to transmit light from the laser diode to the photodetector in a direction parallel to the 011 crystal axis of the cubic crystalline material, the sampler further comprises a compensator disposed between the laser diode and the body of electro-optic material for transforming the linearly-polarized light emitted by the laser diode into circularly-polarized form, and the first and second electrodes are positioned to establish an electric field that is oriented obliquely with respect to the direction of polarization of the linearly-polarized light.

13. A sampler according to claim 12, wherein the electrodes are positioned to establish an electric field that is parallel to the 100 axis of the cubic crystalline material and is disposed at 45° to the direction of polarization of the linearly-polarized light.

14. A sampler according to claim 12, comprising an analyzer positioned to receive light transmitted from the source through the waveguide and to divide light received by the analyzer into an ordinary beam and an extraordinary beam, and wherein said photodetectors is positioned to receive the ordinary beam and the sampler further comprises a second photodetector positioned to receive the extraordinary beam.

15. A sampler according to claim 14, wherein the first-mentioned photodetector and the second photodetector comprise first and second photosensitive devices respectively, the first and second photosensitive devices each having first and second electrodes, the first electrode of the first photosensitive device being connected to a reference potential level, the second electrode of the first photosensitive device being connected to the first electrode of the second photosensitive device, and the second electrode of the second photosensitive device being connected to a reference potential level, each of said photosensitive devices being a unidirectionally-conductive device which responds to optical stimulation by conducting current in the direction from the first electrode to the second electrode, and the first and second photosensitive devices being unbiased, and the sampler further comprising an amplifier having an input terminal connected to the second electrode of the first photosensitive device and also having an output terminal, and a feedback resistor connected to apply feedback from the output terminal of the amplifier to the input terminal thereof.

16. A sampler according to claim 15, wherein the first and second photosensitive devices comprise respective photodiodes.

17. A sampler according to claim 16, wherein the first electrode of the first photosensitive device is connected to the same reference potential as the second electrode of the second photosensitive device.

18. An electro-optic sample comprising a body of semiconductor material that can be energized to emit polarized light, a photodetector for generating an electrical output signal representative of the intensity with which light polarized in a predetermined manner is incident on the photodetector, a body of electro-optic material defining an optical waveguide for transmitting light from the body of semiconductor material to the photodetector, and first and second electrodes for establishing an electrical field within the body of electro-optic material, the index ellipsoid of the body of electro-optic material being circular in cross-section perpendicular to the direction of transmission of light by the waveguide when the first and second electrodes are at the same potential and otherwise being non-circular in cross-section.

* * * * *